United States Patent [19]

Peak

[11] Patent Number: 4,816,746

[45] Date of Patent: * Mar. 28, 1989

[54] CIRCUIT TESTER FOR DETERMINING PRESENCE OR ABSENCE OF ELECTRICAL POWER

[76] Inventor: Rex W. Peak, 106 Randall Ave., Syracuse, N.Y. 13207

[*] Notice: The portion of the term of this patent subsequent to Feb. 16, 2005 has been disclaimed.

[21] Appl. No.: 149,494

[22] Filed: Jan. 28, 1988

Related U.S. Application Data

[63] Continuation-in-part of Ser. No. 364,359, Apr. 1, 1982, Pat. No. 4,725,772.

[51] Int. Cl.[4] .......................................... G01R 19/145
[52] U.S. Cl. ...................................... 324/66; 324/508; 324/555; 324/133; 340/654
[58] Field of Search ................. 324/66, 133, 149, 508, 324/543, 555, 511, 556; 340/656, 654, 635, 540, 500

[56] References Cited

U.S. PATENT DOCUMENTS

| | | | |
|---|---|---|---|
| 3,015,950 | 1/1962 | Doctor et al. | 324/61 R X |
| 3,872,384 | 3/1975 | Laass | 324/555 |
| 4,001,803 | 1/1977 | Lombardo | 340/656 |
| 4,097,843 | 4/1978 | Basile | 340/656 |
| 4,169,357 | 10/1979 | Kelley | 340/654 X |
| 4,233,560 | 11/1980 | Blenman | 324/133 |
| 4,725,772 | 2/1988 | Peak | 324/66 |

*Primary Examiner*—Reinhard J. Eisenzopf
*Assistant Examiner*—Warren S. Edmonds
*Attorney, Agent, or Firm*—Charles S. McGuire

[57] ABSTRACT

The invention concerns circuit testing devices for connection to an existing electrical circuit to determine whether or not power is present across a pair of conductors. The devices are characterized by having a selector switch which may be placed in either a first position, wherein the device is so connected that an audible signal is emitted only when power is present across the conductors to which the device is connected, and a second position, wherein the audible signal is emitted only when power is not present. The device is disclosed in an embodiment which may be used with either AC or DC circuits, each at various voltage levels, and in a further embodiment wherein the audible alarm is actuated by a radio receiver which receives signals from a transmitter connected to the circuit being tested.

13 Claims, 3 Drawing Sheets

4,816,746

CIRCUIT TESTER FOR DETERMINING PRESENCE OR ABSENCE OF ELECTRICAL POWER

REFERENCE TO RELATED APPLICATION

The present application is a continuation-in-part of application Ser. No. 364,359, filed Apr. 1, 1982, now U.S. Pat. No. 4,725,772.

BACKGROUND OF THE INVENTION

The present invention relates to means for testing electrical circuits to determine in which of a plurality of pre-wired circuits a particular outlet or other circuit point is connected, and/or to determine whether there is electrical continuity between a pair of conductors.

In the service wiring of virtually any modern commercial or residential building, an incoming AC power line is connected to a fuse box or other circuit breaking means for protection in the event a circuit is loaded beyond a desired amperage. Normally the structure is wired with a plurality of separate, electrically distinct circuits each connected to a different fuse or circuit breaker. Each circuit may, and commonly does, include a number of receptacles or other outlets for selectively connecting the items to receive electrical power from the circuit.

Many situations arise which make it necessary to determine in which circuit a particular outlet is connected, where this is not otherwise indicated. This can be a very time-consuming operation, especially when it must be performed by one person working alone. In many cases the fuse box or circuit breakers will be located at a considerable distance from the outlet of the circuit being traced, often on a different floor of the building. Many trips back and forth between the outlet and fuse/breaker box may be required before the proper circuit is identified.

Another common situation which arises, for example, during wiring operations in building and elsewhere, is the need to determine whether two conductors are electrically connected. That is, it must be determined whether circuit continuity exists between two conductors where no external power is being provided thereto.

It is an object of the present invention to provide novel and improved apparatus for determining in which of a plurality discrete electrical circuits a particular electrical outlet is connected.

A further object is to provide a circuit tracing apparatus for connection to an existing outlet which will provide an audible indication to an operator at a remote location when electrical power is supplied to said outlet, when operated in a first mode, or when power is removed when operated in a second mode.

Another object is to provide circuit testing apparatus capable of providing an indication of which of a plurality of discrete circuits incorporate a particular outlet or other circuit point, and also of whether circuit continuity exists between two unpowered conductors.

A still further object is to provide circuit tracing apparatus operable in the two above-mentioned modes which may be employed with either AC or DC circuits, each at a plurality of voltage levels.

Still another object is to provide circuit tracing apparatus operable in the two above-mentioned modes which incorporates radio transmitting and receiving means to actuate an audible signal.

Still another object is to provide apparatus of the character described which is small, lightweight, portable, inexpensive and simple in both construction and operation.

Other objects will in part be obvious and will in part appear hereinafter.

SUMMARY OF THE INVENTION

The invention comprises a unit including a small housing (a few inches in height, width and depth) which, in some embodiments, encloses all of the electrical elements and has extending therefrom an electrical cord terminating in means for connection to circuit conductors, such as a male plug. The elements include a DC power source, such as a 6 volt battery, a buzzer or other audible sound-producing means operable by the DC power source, at least one relay, at least one selectively positionable switch and suitable electrical connections thereof.

In a typical circuit tracing application, the switch is placed in a first position and the male plug inserted in a wall receptacle which is connected, through a fuse or circuit breaker, to the incoming AC line. Power thus provided to the unit closes the relay which connects the battery and buzzer through the switch and relay. Thus, the buzzer will sound until power is removed. The operator then proceeds to the fuse/breaker box, within hearing distance of the buzzer, and disconnects the fuse or breaker in a first circuit. If the buzzer continues, the first fuse or breaker is reconnected and that of a second circuit disconnected. The procedure is repeated until, with the disconnection of the fuse or breaker in the circuit which includes the receptacle in which the unit is connected, the relay is opened and the buzzer stops sounding, thereby identifying the circuit in which the receptacle is connected.

The unit may be operated in the reverse mode, i.e. to cause the buzzer to sound when power is applied to the relay rather than when it is removed, by placing the switch in the opposite position.

In a second disclosed embodiment the electrical cord is connected to the relay through an additional switching means, preferably a double-pole, double throw switch When in a first position the cord leads are connected across the relay coil, as in the first embodiment, and the unit is used for circuit tracing as just described. When placed in a second position the cord is connected to terminals of the relay, rather than across the coil. Since no power is provided to the coil the relay switch is always in its de-energized position. The circuit between the battery and buzzer is completed, causing the buzzer to sound, through two conductors connected to the electrical cord leads and to one another. That is, when the second switch means is placed in its second position, circuit continuity between two conductors may be checked by connecting them to the leads of the electrical cord extending from the test device. If the conductors are in electrical communication, i.e. if there is circuit continuity, the battery is connected to the buzzer through the first and second switch means, the electrical cord and conductors, and the normally open contacts of the relay.

Another embodiment includes further switch means and two relays, rather than one, permitting the unit to be utilized with either AC or DC circuits which may be at any of a plurality of voltage levels.

In still another disclosed embodiment the circuit tracing means includes first and second, individual housings, the first containing a radio transmitter and the second a corresponding receiver. The first housing further includes a male plug or other means for connection to a pair of conductors, a relay and a mode selection switch. The second housing includes a battery and buzzer, connected through a relay which may be built into the receiver. The relay in the first housing is closed to cause the transmitter to transmit a signal, preferably of short duration, in response to power to the plug being either supplied or interrupted, depending on the position of the mode switch. The signal from the transmitter is received by the receiver, carried by or near the operator, closing the relay and sounding the buzzer.

DETAILED DESCRIPTION

Figure 1:
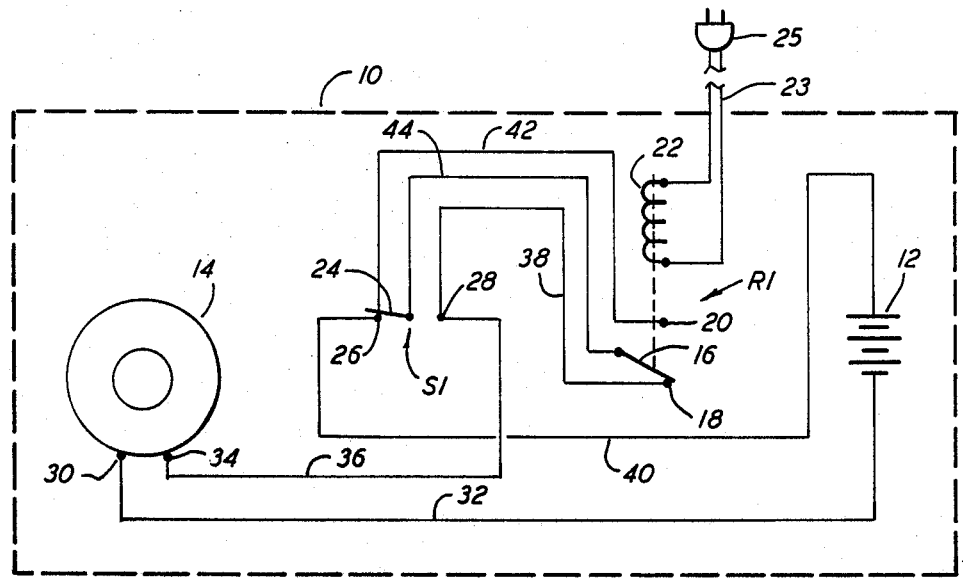
FIG. 1 is an electrical schematic of a first embodiment of the testing apparatus of the invention.

Referring now to the drawings, in FIG. 1 is shown a schematic diagram of test apparatus suitable for tracing an existing electrical circuit from a service outlet to a fuse or other circuit breaking point. Elements of the device are contained in a suitable box or housing indicated diagrammatically by dotted line 10. Such elements include one or more batteries 12 to provide a source of DC power (e.g., 6 volts), a buzzer 14, or other means for producing an audible sound when connected to the DC power source, switch S1 and realy R1. The latter includes switch member 16 movable from the position shown on normally closed contact 18 to normally open contact 20 in response to energization of the relay by providing AC power to coil 22. Leads extending from opposite sides of coil 22 are incorporated in a standard electrical cord 23 of any desired length extending from housing 10 and terminating in standard male plug 25. Switch S1, in the form shown, is a single pole, double throw switch having switch member 24 selectively movable between contacts 26 and 28.

Terminal 30 of buzzer 12 is connected by lead 32 to the negative side of battery 12. Buzzer terminal 34 is connected by lead 36 to switch S1 contact 28, which is connected by lead 38 to relay contact 18. The positive side of battery 12 is connected by lead 40 to switch S1 contact 26, which in turn is connected to normally open relay contact 20 by lead 42. Switching members 16 and 24 of relay R1 and switch S1 are connected to one another by lead 44. As shown in FIG. 1, with switch S1 in the position with member 24 on contact 26 and relay R1 de-energized, buzzer 12 will sound, being connected to the positive side of battery 12 through leads 36 and 38, relay switch member 16, lead 44, switch S1 switch member 24 and lead 40. When the relay is energized, i.e., when plug 25 is connected to a source of AC power, switch member 16 is moved to contact 20, thereby removing the contact of buzzer terminal 34 with the positive side of battery 12, and the buzzer ceases to sound.

For operation in the opposite mode, switch member 24 is moved to contact 28. In this position of switch S1, buzzer 14 is connected to the positive side of battery 12 and will sound when relay R1 is energized. When power is removed from plug 25 and coil 22, movement of switch member 16 back to normally closed contact 18, breaks the connection between the buzzer and battery.

Figure 2:
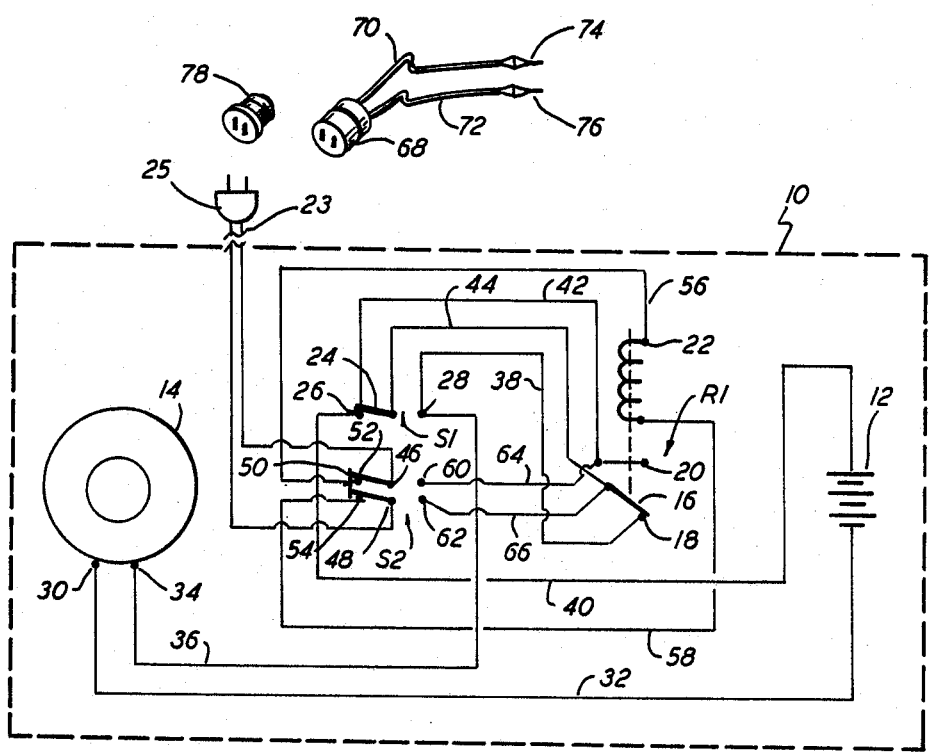
FIG. 2 is a schematic diagram of a second embodiment of the invention.

Turning now to the embodiment of FIG. 2, wherein elements common to the first embodiment are identified by the same reference numbers, a double pole-double throw switch S2 is added. The leads from electrical cord 23 and plug 25 are connected to terminals 46 and 48 of movable switch member 50. When switch member 50 is in the position shown, terminals 46 and 48 are connected to contacts 52 and 54 which are connected by leads 56 and 58 to opposite ends of coil 22. Thus, in order to energize relay R1, switch S2 must be in the position shown in FIG. 2, whereby power may be supplied from an AC source through plug 25, cord 23, switch S2 and leads 56 and 58 to coil 22. Switch S1 may then be placed in either of its two positions and circuit tracing may be performed in the same way as previously described in connection with FIG. 1. That is, in the position shown, with switch member 24 on contact 26 (as also shown in FIG. 1), buzzer 14 will be connected to battery 12 and will sound as long as relay R1 remains de-energized, and will stop sounding when the relay is energized. If switch member 24 is moved to contact 28, the buzzer will sound when the relay is energized and will stop sounding when power is removed from coil 22. This operation is exactly the same as that of the FIG. 1 embodiment, coil 22 being connected to cord 23 through switch S2 rather than directly.

Placing switch S2 in the opposite position, i.e., with switch member 50 engaging contacts 60 and 62 provides an additional function, namely, determining whether or not two conductors are in electrical communication (circuit continuity) where neither conductor is connected to an electric power supply. Relay R1 will always remain de-energized when the testing device is used for continuity checking since there is no way to connect coil 22 to an AC power source with switch S2 in its alternate position. Switch S1 is also placed in the position alternate to that shown, with switch member 24 engaging contact 28 for continuity checking. With the testing device thus programmed by placing switches S1 and S2 in their alternate positions (opposite to those illustrated), buzzer 14 will sound when the circuit is completed through two conductors which are connected to the respective prongs of plug 25. That is, terminal 34 of the buzzer will be connected to the positive side of battery 12 through lead 36, contact 28, lead 38, contact 18, switch member 16, lead 66, switch S2, electrical cord 23, plug 25, the two communicating conductors connected to the plug prongs, back through switch S2 to lead 64, lead 42 and lead 40 to the battery. Thus, buzzer 14 will sound if two conductors contacted by the prongs of plug 25 are in circuit continuity, and will not sound if the conductors are not in continuity.

The performance of continuity checking may be simplified by providing a female receptacle 68 for receiving plug 25 and having leads 70 and 72 extending therefrom to terminate in so-called alligator clips 74 and 76. The latter may be engaged with the bare conductors being checked for circuit continuity, or when circuit tracing is performed through bare conductors rather than through a female receptacle which is directly wired into the circuit. Also, a standard threaded receptacle 78 may be provided an an additional accessory when it is necessary to connect the test device through an open, internally threaded socket.

If desired, an additional switch may be provided, for example, in the line connected to the positive side of the battery an an on/off switch for the entire device, but is not necessary for operation in the manner described. One or more fuses (not shown) of appropriate amperage would also be provided in conventional manner for protecting circuit components.

Figure 3:
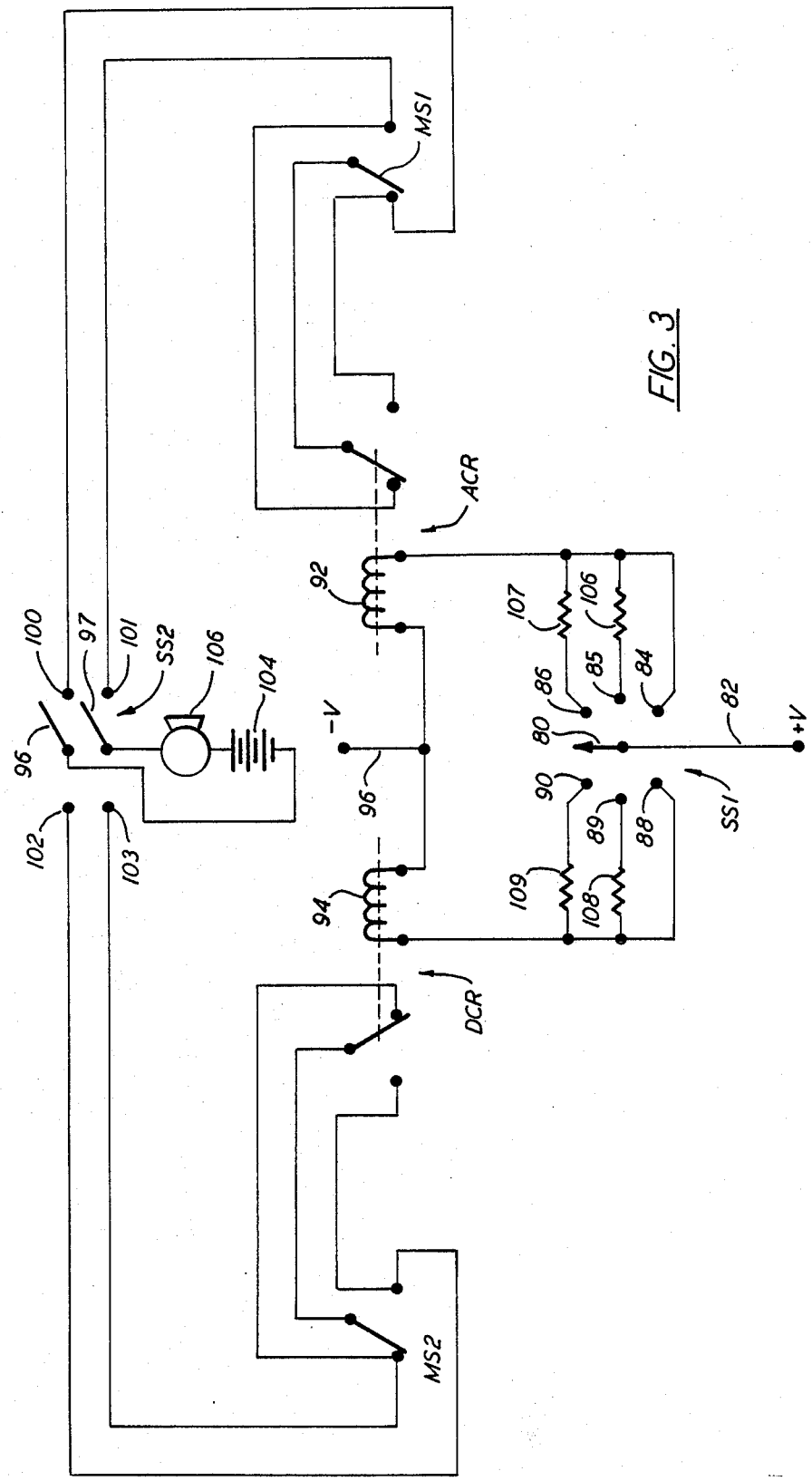
FIG. 3 is a schematic diagram of a third embodiment of the invention.

FIG. 3 is a schematic diagram of another embodiment of circuit tracing apparatus, suitable for use with either AC or DC circuits, at various voltage levels. First selector switch SS1, e.g., a conventional, multi-contact rotary switch, includes movable arm 80 connected to lead 82. Arm 80 may be placed in the neutral position, as shown in FIG. 3, or in engagement with any one of contacts 84, 85 or 86 on one side of the switch, or contacts 88, 89 or 90 on the other side. Each of contacts 84, 85 and 86 is connected to one side of coil 92 of AC relay ACR; likewise, contacts 88, 89 and 90 are all connected to one side of coil 94 of DC relay DCR. The other sides of both coils 92 and 94 are connected to lead 96.

Second selector switch SS2, a double pole, double throw switch, includes jointly movable contact arms 96, 97 which may be placed in engagement with a first pair 100, 101 or a second pair 102, 103, of fixed contacts. Contact arm 96 is connected to one side of battery 104, the other side of which is connected to one side of buzzer 106. The other side of the buzzer is connected to contact arm 97.

When the device of FIG. 3 is to be used for circuit tracing applications with AC circuits, contact arm 80 is placed on one of contacts 84, 85 or 86, depending on the level of voltage of the circuit. For example, three of the more commonly encountered voltages in AC circuits are 110, 24 and 12 volts. Relay ACR is adapted for operation at the lowest voltage level with which the device is to be used, and arm 80 is placed on contact 84, thereby connecting leads 82 and 96 directly across relay coil 92. Resistors 106 and 107 are placed in the lines between coil 92 and contacts 85 and 86, respectively, and have values of resistance necessary to reduce the voltage to the proper level when the device is used with circuits of higher voltage.

In the same manner, coil 94 of DC relay DCR is connected to leads 82 and 96 through arm 80 and the one of contacts 88, 89 and 90 with which it is engatged. For example, operation with DC circuits of 6, 12 or 24 volts may be provided with resistors 108 and 109 reducing the voltage to the proper level when arm 80 engages contacts 89 and 90, respectively. Arms 96 and 97 are placed in engagement with contacts 100 and 101 when the device is operated with AC circuits, and with contacts 102 and 103 for DC operation. Selector switches SS1 and SS2 may be designed for joint operation so that movement of arm 80 to engage any of contacts 84, 85 and 86 automatically moves arms 96 and 97 to engage contacts 100 and 101, and to the opposite position for DC operation. The schematic diagram, however, illustrates the functional operation of the device.

First and second mode selection switches MS1 and MS2 are connected to the contacts of AC and DC relays ACR and DCR, respectively. The purpose of these switches, as in the case of switch S1 of FIGS. 1 and 2, is to permit convenient use of the apparatus in two typical circuit tracing applications. For example, if it is desired to remove power from a given wall receptacle for purposes of repair, replacement, etc. the mode selection switch is set in a first position which causes the buzzer to sound when power is removed from the incoming leads (or male plug) of the device. Thus, the operator may connect the device to the receptacle, and proceed to the fuse or breaker box and open the circuits one at a time until the buzzer sounds, signalling the fact that power has been removed from the receptacle, which may then be safely repaired or replaced. On the other hand, when power is not initially present at the receptacle in question, e.g., in newly wired installations, the mode selection switch is placed in the opposite position, causing the buzzer to sound when power is connected to the receptacle. The sound of the buzzer signals the fact that the circuit including the receptacle to which the device is connected has been activated.

Figure 4:
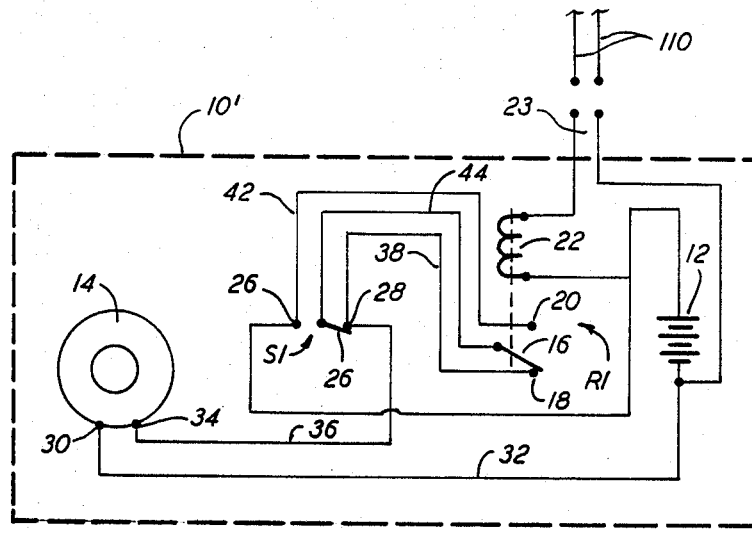
FIG. 4 is a schematic diagram of a modified version of the embodiment of FIG. 1.

FIG. 4 illustrates the circuite of a device 10 similar to device 10 of FIG. 1, but adapted only for continuity checking rather than circuit tracing Reference numerals common with the FIG. 1 device are used, all of the same elements being present. The only difference in circuit configuration is that the leads of cord 23 are not respectively connected directly across coil 22, battery 12 is connected between one of the leads and one side of the coil. When it is desired to determine whether or not circuit continuity exists between a pair of conductors 110, the leads of cord 23 are respectively connected thereto with switch S1 in a first position if it is desired that buzzer 14 sounding indicates circuit continuity, or a second position if the buzzer is to indicate lack of continuity. Relay R1 is a DC relay, actuated by connecting battery 12 across coil 22 when the leads of cord 23 are connected to conductors 110 and the latter are connected to one another, i.e., when circuit continuity exists. Actuation of relay R1 may either cause buzzer 14 to sound, or prevent it from sounding, depending upon the position of switch S1.

Figure 5:
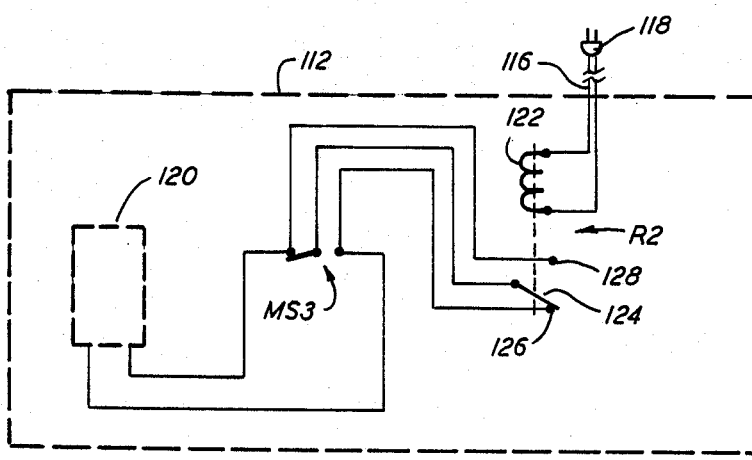
FIGS. 5 and 6 are schematic diagrams of two separate components of another embodiment of the invention.
Figure 6:
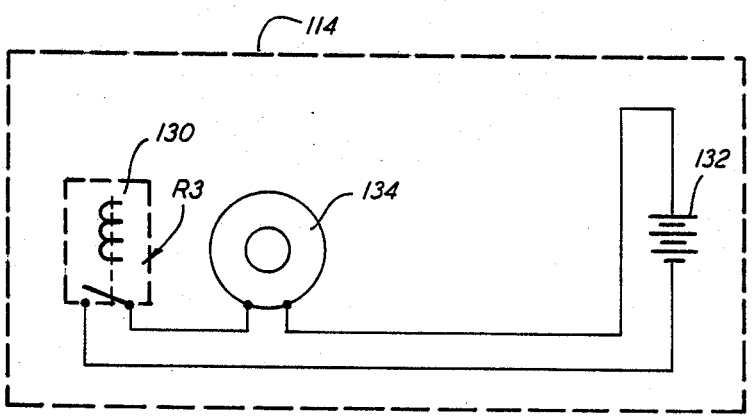

In FIGS. 5 and 6 are shown a pair of separately packaged devices 112 and 114, for use in circuit tracing applications where there may be a considerable distance between the position of the receptacle, or other point in the circuit to which connection is made, and the fuse or breaker box, or for any other reason it is desired to have the buzzer near the operator. Device 112 includes a housing from which cord 116, terminating in male plug 118, extends, and containing relay R2, mode selector switch MS3 and a small RF transmitter 120. Coil 122 of relay R2 is connected at opposite sides to the two leads of cord 116 and will thus move switching member or arm 124 from contact 126, as shown, to contact 128 when power is present at the receptacle to which plug 118 is connected. Depending upon the position of mode selection switch MS3, either actuation or deactuation of relay R2, i.e., either connecting or disconnecting power to or from the receptacle to which plug 118 is connected, may serve to complete the circuit to cause transmitter 120 to transmitan RF signal.

The signal from transmitter 120 is received at device 114 by receiver 130 and causes actuation of relay R3, completing the circuit between battery 132 and buzzer 134, thereby signalling that power has either been connected to or disconnected from the receptacle to which plug 118 is connected, depending upon the position in which switch MS3 has been placed. Transmitter 120 is preferably of the type having a built-in capacitor which provides transmitting power for only a few seconds and must be recharged before another transmission will occur. In this way, the buzzer will not continue to sound for a period in excess of that required to provide the intended information. Also, receiver 130 is preferably of the commerically available type having a built-in relay.

What is claimed is:

1. Electrical circuit testing apparatus comprising:
   (a) a source of DC power;
   (b) means for producing an audible sound when connected to said DC power source;
   (c) at least one relay including a coil and a first contact arm movable from engagement with a first contact to engagement with a second contact in response to supply of electrical power to said coil;
   (d) a pair of electrical leads for respective contact with a pair of conductors of the circuit to be tested;
   (e) at least one selector switch having a second contact arm selectively movable between first and second positions wherein said second contact arm is in engagement with third and fourth contacts, respectively; and
   (f) circuit means so connecting said DC power source, sound producing means, a pair of leads, relay and selector switch that said DC power source is connected to said sound producing means;
      (i) when power is supplied to said coil via said pair of leads and said selector switch is in said first position, and
      (ii) when power, initially supplied to said coil via said pair of leads, is removed from said coil and said selector switch is in said second position.

2. The invention according to claim 1 wherein said relay is a DC relay and said coil is connected across said DC power source by contact of said pair of leads with said conductors when the latter are in electrical continuity.

3. The invention according to claim 1 wherein said electrical leads terminate in connections with the prongs of a male plug and for connection to said conductors by insertion in a female receptacle.

4. The invention according to claim 1 and further including a unitary housing wherein all of said DC power source, sound producing means, selector switch and relay are enclosed, with said leads extending therefrom.

5. The invention according to claim 1 and further including additional switch means comprising a pair of third contact arms to which said pair of leads are respectively connected, a first pair of terminals connected across said relay coil and a second pair of terminals respectively connected to said second contact arm and said third contact of said selector switch.

6. The invention according to claim 1 wherein said apparatus includes an AC relay and a DC relay, and further including additional switch means having a third contact arm selectively movable between at least one fifth contact and at least one sixth contact, said pair of leads being respectively connected to said third contact arm and to one side of the coils of both said AC and DC relays, said fifth and sixth contacts being respectively connected to the other side of the coils of said AC and DC relays.

7. The invention according to claim 6 wherein said fifth and sixth contacts each comprise plurality of individual fixed contacts, any of which may be selectively engaged by said third contact arm.

8. The invention according to claim 7 wherein a predetermined resistance is placed between at least all but one of each of said plurality of fifth contacts and said AC relay coil, and between at least all but one of each of said plurality of sixth contacts and said DC relay.

9. The invention according to claim 8 wherein said apparatus includes a pair of said selector switches, a first of which is operable when said third contact arm is in engagement with one of said fifth contacts, and a second of which is operable when said third contact arm is in engagement with one of said sixth contacts.

10. The invention according to claim 1 and further including a transmitter adapted to transmit an RF signal in response to actuation of said relay with said selector switch in said first position, and in response to deactuation of said relay with said selector switch in said second position, and a receiver adapted to connect said DC power source across said sound producing means in response to reception of said signal.

11. The invention according to claim 10 and further including a first housing wherein said relay, selector switch and transmitter are enclosed, and a second housing wherein said DC power source, sound producing means and receiver are enclosed.

12. The invention according to claim 11 and further including an additional relay in said second housing actuable in response to said signal being received by said receiver to connect said DC power source across said sound producing means.

13. The invention according to claim 12 wherein said additional relay is built into said receiver.

* * * * *